(12) United States Patent
Terazawa et al.

(10) Patent No.: US 6,940,443 B2
(45) Date of Patent: Sep. 6, 2005

(54) ANALOG TO DIGITAL CONVERTER WITH A PULSE DELAY CIRCUIT

(75) Inventors: Tomohito Terazawa, Gifu (JP); Takamoto Watanabe, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/942,097

(22) Filed: Sep. 16, 2004

(65) Prior Publication Data

US 2005/0057388 A1 Mar. 17, 2005

(30) Foreign Application Priority Data

Sep. 17, 2003 (JP) ........................................ 2003-324823

(51) Int. Cl.[7] .............................................. H03M 1/12
(52) U.S. Cl. ....................................................... 341/157
(58) Field of Search ................................. 341/157, 166, 341/155, 118, 129, 163; 342/166; 327/3; 363/132; 377/42, 124

(56) References Cited

U.S. PATENT DOCUMENTS

| 5,055,845 | A | * | 10/1991 | Ridkosil ..................... 341/155 |
| 5,396,247 | A | | 3/1995 | Watanabe et al. |
| 5,416,444 | A | | 5/1995 | Ohtsuka et al. |
| 6,255,976 | B1 | | 7/2001 | Watanabe et al. |
| 6,304,202 | B1 | * | 10/2001 | Pastorello et al. .......... 341/155 |
| 6,388,601 | B1 | * | 5/2002 | De Gouy et al. ............ 341/155 |
| 6,466,151 | B2 | | 10/2002 | Nishii et al. |
| 6,492,930 | B2 | * | 12/2002 | Enriquez ..................... 341/155 |
| 6,509,861 | B2 | | 1/2003 | Watanabe |
| 6,724,338 | B1 | * | 4/2004 | Min et al. ................... 341/155 |

FOREIGN PATENT DOCUMENTS

| JP | 5-259907 | 10/1993 |
| JP | 6-216721 | 8/1994 |
| JP | 2000-283790 | 10/2000 |
| JP | 2002-118467 | 4/2002 |
| JP | 2002-217758 | 8/2002 |

* cited by examiner

*Primary Examiner*—Brian Young
(74) *Attorney, Agent, or Firm*—Posz Law Group, PLC

(57) ABSTRACT

An A/D converter has a pulse delay circuit including a plurality of inverting circuits to each of which an analog voltage signal is inputted through a first pair of power supply lines. Each of the inverting circuits has a first logic gate. The A/D converter has a logic circuit having a second logic gate and a second pair of power supply lines, the logic circuit operating based on a power supply voltage. At least one of a first range of a level of the voltage signal and a second range of the power supply voltage is set to prevent a tunneling current from flowing at least one of between the first paired power supply lines and between the second paired power supply lines when at least one of first and second logic gates operates.

21 Claims, 10 Drawing Sheets

ANALOG TO DIGITAL CONVERTER WITH A PULSE DELAY CIRCUIT

CROSS REFERENCE TO RELATED APPLICATION

This application is based upon and claims the benefit of priority of the prior Japanese Patent Application 2003-324823 filed on Sep. 17, 2003 so that the descriptions of which are incorporated herein by reference.

BACKGROUND OF THE INVENTION

1. Field of the Invention

The present invention relates to an analog-to-digital converter for converting an analog signal to digital data, which is referred to simply as "A/D converter" hereinafter. In particular, the present invention relates to an A/D converter having a pulse delay circuit for sending a pulse signal while delaying the pulse signal in stages.

2. Description of the Related Art

A/D converters each including a pulse delay circuit having inverters connected in series and adapted to send a pulse signal while delaying it in stages have been well known. In particular, A/D converters each including a ring-gate delay circuit, as one type of the pulse delay circuit have also been well known. The ring-gate delay circuit has inverters serially connected in a ring.

Some of the A/D converters each including the ring-gate delay circuit are disclosed in, for example, U.S. Pat. No. 5,396,247 corresponding to Japanese Unexamined Patent Publication No. HS-259907, and U.S. Pat. No. 6,466,151 corresponding to Japanese Unexamined Patent Publication No. 2002-118467.

In addition, U.S. Pat. No. 6,509,861 corresponding to Japanese Unexamined Patent Publication No. 2002-217758 discloses an A/D converter including a non-circular pulse delay circuit, as another type of the pulse delay circuit, having inverters serially connected in a row. The A/D converter disclosed in U.S. Pat. No. 6,509,861 has a function of filtering off high-frequency noise components from a voltage signal Vin inputted to the non-circular pulse delay circuit. U.S. Pat. No. 6,255,976 corresponding to Japanese Patent Publication No. 3,292,182 discloses a sensor circuit including an A/D converter having such a pulse delay circuit and a method of eliminating low-frequency noise components caused in the sensor circuit. U.S. Pat. No. 5,416,444 corresponding to Japanese Unexamined Patent Publication No. H6-216721 discloses a ring-gate delay circuit, in other words, a ring oscillator, which has an even number of stages of inverters and is integratable with A/D converters.

The A/D converter disclosed in U.S. Pat. No. 6,466,151 is operative to convert a certain low level of an input voltage signal Vin to digital data. The A/D converter is composed of CMOS (Complementary Metal Oxide Semiconductor) transistors.

Various combinations of the CMOS transistors provide logic gates which perform particular logical functions, such as an inverter (NOT gate), an AND gate, an OR gate, a NAND gate, and so on.

FIG. 13 illustrates one of the inverters that constitute a component of the A/D converter disclosed in U.S. Pat. No. 6,466,151. As shown in FIG. 13, the inverter 300 is provided with a pair of complementary transistors (a p-channel transistor 100$p$T and an n-channel transistor 100$n$T). A power supply voltage, for example, VDDL is applied through a power supply line L100 to the p-channel transistor 100$p$T.

It is assumed that an input signal Ro having a voltage range between a high voltage level of Vin and a low voltage level of 0V [volts] is inputted to an input terminal 320 of the inverter 300, which is illustrated in FIG. 13. In FIG. 13, a period of time "a" indicates that the input signal Ro is kept at the low voltage level and a period of time "b", that is, an excessive period, indicates that the input signal Ro is being turned from the low voltage level to the high voltage level. A period of time "c" indicates that the input signal Ro is kept at the high voltage level and a period of time "d", in other words, an excessive period, indicates that the input signal Ro is being turned from the high voltage level to the low voltage level.

When the p-channel transistor 100$p$T is turned on and the n-channel transistor 100$n$T is turned off, a charging current Yb flows across the p-channel transistor 100$p$T out to a capacitance 360 between an output line 340 and a ground line L200.

When the p-channel transistor 100$p$T is turned off and the n-channel transistor 100$n$T is turned on, a discharging current Yc flows from the capacitance 360 into the n-channel transistor 100$n$T.

In addition, when both the p-channel transistor 100$p$T and the n-channel transistor 100$n$T are temporarily turned on, the switching operations of complementary transistors 100$p$T and 100$n$T may cause generation of a tunneling current Ya flowing between the power supply line L100 and the ground line L200. This tunneling current Ya may cause power consumption of the A/D converter to increase.

SUMMARY OF THE INVENTION

The present invention is made on the background so that preferable embodiments of the present invention can reduce power consumption of an A/D converter with a pulse delay circuit.

According to one aspect of the present invention, there is provided an analog-to-digital converter for converting an analog voltage signal into digital data. The analog-to-digital converter according to the one aspect is provided with a pulse delay circuit including a plurality of inverting circuits to each of which the analog voltage signal is inputted through a first pair of power supply lines connected thereto. The inverting circuits are sequentially connected with each other. Each of the inverting circuits comprises a first logic gate and operates to invert a pulse signal inputted thereto so as to output an inversion of the pulse signal. The inverting operation of each of the, inverting circuits provides a predetermined delay time, and the delay time of each of the inverting circuits depends on a level of the voltage signal. The analog-to-digital converter according to the one aspect is provided with a voltage signal input terminal connected to one of the first paired power supply lines through which the voltage signal is applied. The analog-to-digital converter according to the one aspect is provided with a logic circuit having a second logic gate and a second pair of power supply lines. The logic circuit operates based on a constant power supply voltage inputted to one of the second paired power supply lines to detect a number of the inverting circuits through which the pulse signal passes within a predetermined setting time so as to generate digital data according to the detected number of the inverting circuits. At least one of a first range of the level of the voltage signal and a second range of the power supply voltage is set to prevent a tunneling current from flowing at least one of between the first paired power supply lines and between the second paired power supply lines when at least one of the first and second logic gates operates.

According to another aspect of the present invention, there is provided an analog-to-digital converter for converting an analog voltage signal into digital data. The analog-to-digital converter according to another aspect is provided with a pulse delay circuit including a plurality of inverting circuits to each of which the analog voltage signal is inputted through a first pair of power supply lines connected thereto. The inverting circuits are sequentially connected with each other. Each of the inverting circuits operates to invert a pulse signal inputted thereto so as to output an inversion of the pulse signal. The inverting operation of each of the inverting circuits provides a predetermined delay time, and the delay time of each of the inverting circuits depends on a level of the voltage signal. The analog-to-digital converter according to another aspect is provided with a voltage signal input terminal connected to one of the first paired power supply lines through which the voltage signal is applied. The analog-to-digital converter according to another aspect is provided with a logic circuit having a logic gate and a second pair of power supply lines. The logic circuit operates based on a constant power supply voltage inputted to one of the second paired power supply lines to detect a number of the inverting circuits through which the pulse signal passes within a predetermined setting time so as to generate digital data according to the detected number of the inverting circuits. A first range of the level of the voltage signal and a second range of the power supply voltage are set to prevent a constant tunneling current from flowing between the second paired power supply lines when the logic gate operates.

According to a further aspect of the present invention, there is provided an analog-to-digital converter for converting an analog voltage signal into digital data. The analog-to-digital converter according to another aspect is provided with a pulse delay circuit including a plurality of inverting circuits to each of which the analog voltage signal is inputted through a first pair of power supply lines connected thereto. The inverting circuits are sequentially connected with each other. Each of the inverting circuits comprises a first logic gate and operates to invert a pulse signal inputted thereto so as to output an inversion of the pulse signal. The inverting operation of each of the inverting circuits provides a predetermined delay time, and the delay time of each of the inverting circuits depends on a level of the voltage signal. The analog-to-digital converter according to another aspect is provided with a voltage signal input terminal connected to one of the first paired power supply lines through which the voltage signal is applied. The analog-to-digital converter according to another aspect is provided with a logic circuit having a second logic gate and a second pair of power supply lines. The logic circuit operates based on a power supply voltage inputted to one of the second paired power supply lines to detect a number of the inverting circuits through which the pulse signal passes within a predetermined setting time so as to generate digital data according to the detected number of the inverting circuits. The second logic gate includes opposite conductivity types of transistors each having a threshold voltage, and the second voltage range of the power supply voltage is set to a range equal to or lower than a sum of absolute values of the threshold voltages.

According to a still further aspect of the present invention, there is provided an analog-to-digital converter for converting an analog voltage signal into digital data. The analog-to-digital converter according to another aspect is provided with a pulse delay circuit including a plurality of inverting circuits to each of which the analog voltage signal is inputted through a first pair of power supply lines connected thereto. The inverting circuits are sequentially connected with each other. Each of the inverting circuits comprises a first logic gate and operates to invert a pulse signal inputted thereto so as to output an inversion of the pulse signal. The inverting operation of each of the inverting circuits provides a predetermined delay time, and the delay time of each of the inverting circuits depends on a level of the voltage signal. The analog-to-digital converter according to another aspect is provided with a voltage signal input terminal connected to one of the first paired power supply lines through which the voltage signal is applied. The analog-to-digital converter according to another aspect is provided with a logic circuit having a second logic gate and a second pair of power supply lines. The logic circuit operates based on a power supply voltage inputted to one of the second paired power supply lines to detect a number of the inverting circuits through which the pulse signal passes within a predetermined setting time so as to generate digital data according to the detected number of the inverting circuits. The first logic gate includes opposite conductivity types of transistors each having a threshold voltage, and the first voltage range of the power supply voltage is set to a range equal to or lower than a sum of absolute values of the threshold voltages.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

Embodiments of the invention will be described hereinafter with reference to the accompanying drawings.

[First Embodiment]

Figure 1:
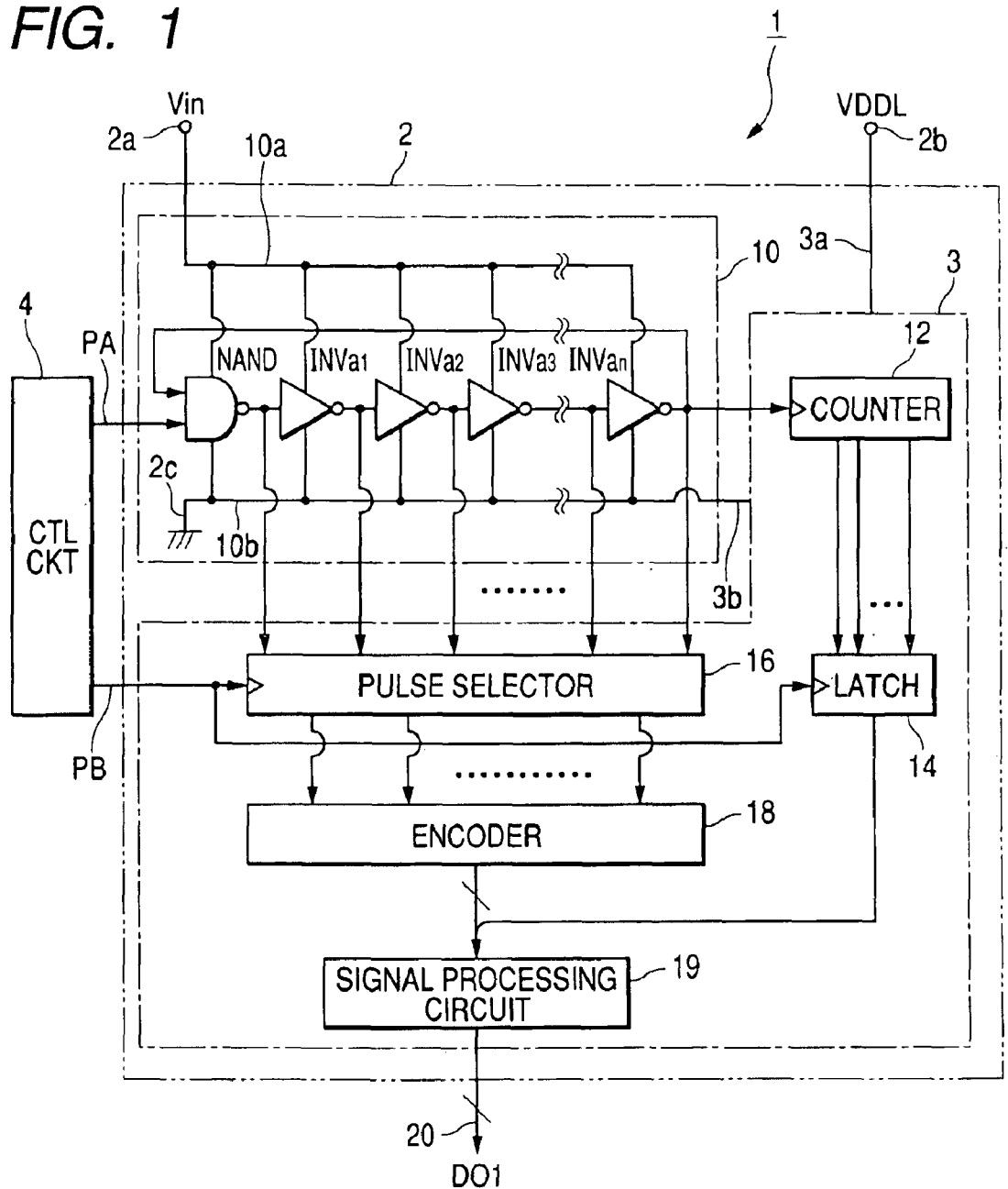
FIG. 1 is a block diagram schematically illustrating a structure of an A/D converter according to a first embodiment of the present invention.

As shown in FIG. 1, an A/D converter 1 according to a first embodiment of the present invention is provided with a control circuit 4 for generating pulse signals PA and PB. The A/D converter 1 is provided with a pulse phase difference coding circuit 2 having one and other input terminals 2a and 2b for coding a phase difference between the pulse signals PA and PB.

The pulse phase difference coding circuit 2 is provided with a ring-gate delay circuit 10. The ring-gate delay circuit 10 is preferably composed of an odd number (for example, 15) of inverting circuits. Specifically, as the odd number of inverting circuits, a NAND gate NAND and an even number of inverters INVa1 to INVan (n: even number) are preferably used. The NAND gate NAND has one and other input terminals and one output terminal, and is designed so that the pulse signal PA is inputted to the one input terminal thereof.

In particular, the NAND gate NAND and the inverters INVa1 to INVan are connected in series in a ring. That is, the other input terminal of the NAND gate NAND and an output terminal of the final stage of inverter INVan are connected to each other so that the NAND gate NAND and the inverters INVa1 to INVan are serially connected to have a ring-like structure, constituting the ring-gate delay circuit 10.

While the level of the pulse signal PA is a low level, the NAND gate NAND, which is served as the first stage of delay, outputs a pulse signal whose level is high. The inverter INVa1 inverts the outputted pulse signal to output a pulse signal whose level is low. Each of the remaining inverters INVa2 to INVan (stages of delay) sequentially inverts a pulse signal outputted from the previous inverter. Because the number of the inverting circuits of the ring-gate delay circuit 10 is the odd number, the level of the pulse signal outputted from the last stage of inverter INVan is high. That is, while the level of the pulse signal PA is the low level, each of the levels of the outputted pulse signals from the inverting circuits of the ring-gate delay circuit 10 is constant.

When the level of the pulse signal PA is turned to a high level, the NAND gate NAND starts to operate. That is, the NAND gate NAND outputs a pulse signal whose level is inverted to the low level because the level of the pulse signal inputted to the other input terminal of the NAND gate NAND is high. This indicates that the pulse signal PA shifts to the output of the inverter INVa1.

The inverter INVa1 inverts the outputted pulse signal to output a pulse signal whose level is high. Each of the remaining inverters INVa2 to INVan sequentially inverts a pulse signal outputted from the previous inverter to output it so that the levels of the pulse signals outputted from the inverters INVa2 to INVan are inverted as compared with the case when the level of the pulse signal PA is the low level. As a result, the level of the pulse signal outputted from the last stage of inverter INVan is inverted to the low level.

Subsequently, when the pulse signal whose level is low is inputted to the other input terminal of the NAND gate NAND, the level of the output signal from the NAND gate NAND is inverted to the high level. This results in that the level of the output signal from the inverter INVa1 is turned to the low level and therefore, the level of the output signal from the inverter INVa2 is turned to the high level. This indicates that the pulse signal PA shifts to the output of the inverter INVa2.

That is, in response to the rising edge of the pulse signal PA, the riding edge of the pulse signal PA is sequentially circulated through the inverting circuits of the ring-gate delay circuit 10 while the level of the pulse signal PA is the high level.

These inverting operations of the inverting circuits (NAND and INVa1 to an) of the ring-gate delay circuit require predetermined delay times, respectively, which are served as first to final stages of delay, so that they circulate the rising edge of the pulse signal PA while delaying it at the predetermined delay times, respectively.

The pulse phase difference coding circuit 2 is also provided with a counter 12 connected to the output terminal of the final stage of the inverter INVan and operative to count the number of times of the circulation of the rising edge of the pulse signal PA through the circularly connected NAND gate NAND and the inverters INVa1 to INVan. The counter 12 is also operative to convert the counted number of times of the circulation of the rising edge of the pulse signal PA to predetermined bits of binary digital data.

The pulse phase difference coding circuit 2 is further provided with a latch 14. The latch 14 is designed so that the pulse signal PB is inputted thereto. That is, the latch 14 starts to operate when the level of the pulse signal PB is turned to a high level, thereby latching the digital data outputted from the counter 12.

The pulse phase difference coding circuit 2 is provided with a pulse selector 16 connected to the output terminals of the NAND gate NAND and the inverters INVa1 to INVan, respectively. The pulse selector 16 is operative to detect a circulation position at which the rising edge of the pulse signal PA has reached in the rig-gate delay circuit 10 when the level of the pulse signal PB is turned to the high level based on the output levels of the NAND gate NAND and the inverters INVa1 to INVan. The pulse selector 16 is operative to output a signal indicative of the circulation position of the rising edge of the pulse signal PA.

The pulse phase difference coding circuit 2 is provided with a encoder 18 connected to the pulse selector 16. The encoder 18 is operative to convert the signal outputted from the pulse selector 16 into predetermined bits of binary digital data. The pulse phase difference coding circuit 2 is provided with a signal processing circuit 19 connected to the latch 14 and the encoder 18, respectively. The signal processing circuit 19 is operative to generate binary digital data DO1 representing the phase difference between the pulse signals PA and PB according to the digital data latched by the latch 14 and the digital data outputted from the encoder 18.

The pulse phase difference coding circuit 2 is provided with a data output line 20 connected to the signal processing circuit 19 and configured to output the digital data DO1 to the exterior of the pulse phase difference coding circuit 2.

The counter 12, the latch 14, the pulse selector 16, the encoder 18, and the signal processing circuit 19 are designed in a logic circuit module that is referred to as "coding block" to which a reference character of 3 is assigned.

Specifically, in the pulse phase difference coding circuit 2, the ring-gate delay circuit 10 starts to circulate the rising edge of the pulse signal PA when the level of the pulse signal PA is turned to the high level. That is, the rising edge of the pulse signal PA circulates through the NAND gate NAND and the inverters INVa1 to INVan while the pulse signal PA is kept at the high level.

The number of times of the circulation of the rising edge is counted by the counter 12. When the level of the pulse signal PB generated by the control circuit 4 is changed to the high level, the counted result of the counter 12 is converted to the binary digital data to be latched by the latch 14.

When the level of the pulse signal PB is changed to the high level, the circulation position at which the inputted rising edge of the pulse signal PA has reached in the ring-gate delay circuit 10 is detected by the pulse selector 16. The circulation position of the rising edge when the level of the pulse signal PB is changed to the high level is converted by the encoder 18 into the binary digital data.

According to the digital data latched by the latch 14 and that outputted from the encoder 18, the digital data DO1 corresponding to a time Tc between the rising edge of the pulse signal PA and that of the pulse signal PB is generated by the signal processing circuit 19. The time Tc corresponds to a phase difference between the pulse signals PA and PB.

The digital data DO1 represents what number of stages (NAND gate and inverters) through which the pulse signal PA passes during the time Tc.

The digital data DO1 is outputted from the signal processing circuit 19 through the data output line 20.

For example, it is assumed that the number of stages (the sum of the NAND gate and the inverters INVa1 to INVan) is 15, the digital data outputted from each of the latch 14 and the encoder 18 is 4 bits. In this assumption, the signal processing circuit 19 subtracts the 4-bit data from the 4-bit data outputted from the encoder 18 to generate 4-bit data. Subsequently, the signal processing circuit 19 combines the generated 4-bit data as lower-order 4 bits of digital data with the 4-bit data latched by the latch 14 as higher-order 4 bits of the digital data, thereby generating the digital data of 8 bits as the digital data DO1.

In addition, each of the inverting circuits constituting the NAND gate NAND and the inverters INVa1 to INVan are connected to a power supply line $10a$ through which power is supplied to each of the NAND gate NAND and the inverters INVa1 to INVan. The power supply line $10a$ is connected to the one input terminal $2a$ of the pulse phase difference coding circuit 2 to which a voltage signal Vin to be A/D converted is inputted. That is, the voltage signal Vin is applied to each of the inverting circuits (NAND gate and inverters INVa1 to INVan) as a power supply voltage signal.

The delay time of each of the inverting circuits NAND and INVa1 to INVan depends on the voltage signal (power supply voltage signal) Vin applied thereto so that the digital data DO1 outputted from the data output line 20 changes depending on the voltage level of the voltage signal Vin. Keeping the time Tc constant allows the digital data DO1 to correspond to the voltage signal Vin.

Figure 2:
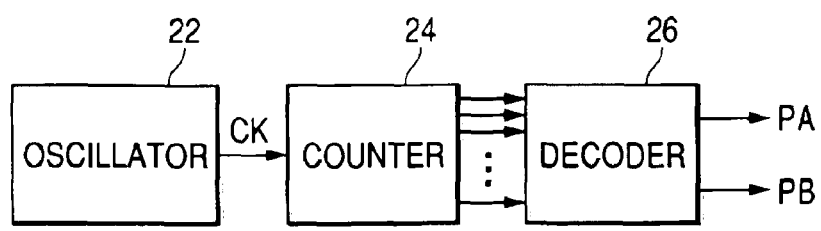
FIG. 2 is a block diagram schematically illustrating a structure of a control circuit shown in FIG. 1 according to the first embodiment of the present invention.

Under the feature, in the A/D converter 1, the control circuit 4 preferably has the structure shown in FIG. 2. That is, the control circuit 4 is provided with an oscillator 22 operative to generate a signal CK oscillating at a specified reference frequency. The control circuit 4 is provided with a counter 24 connected to the oscillator 22 and operative to count the reference frequency of the oscillating signal CK. The control circuit 4 is provided with a decoder 26 connected to the counter 24 and operative to periodically generate the pulse signals PA and PB based on the counted result. The decoder 26 is operative to consistently keep the time Tc between each rising edge of each pulse signal PA and each rising edge of each pulse signal PB constant (see FIG. 3A).

Figure 3A:
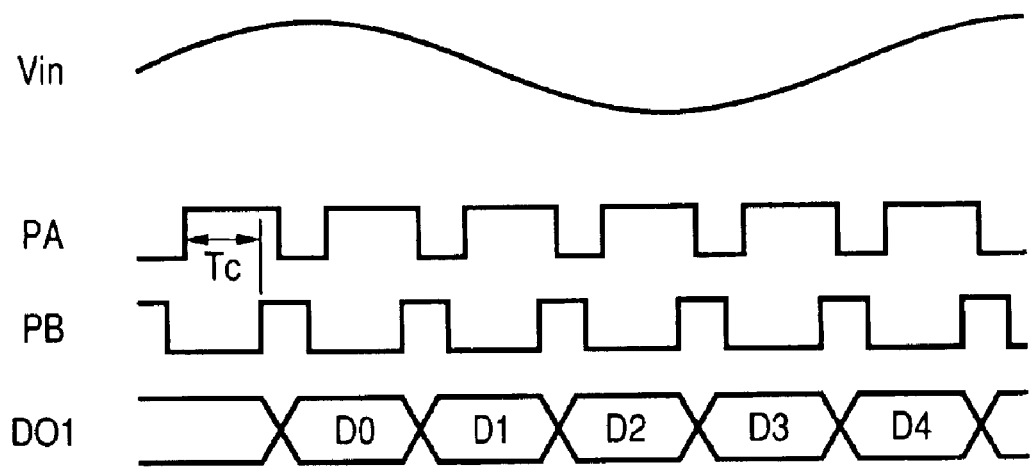
FIG. 3A is a time chart for explaining one example of operations of the A/D converter according to the first embodiment of the present invention.

This structure of the control circuit 4 results in that, as shown in FIG. 3A, the digital data DO1 corresponding to the voltage level of the voltage signal Vin is outputted from the pulse phase difference coding circuit 2. The A/D conversion operations of the A/D converter 1 are periodically performed in simultaneously with the periods of the pulse signals PA and PB so that the digital data DO1 sequentially changes like data values of D0, D1, D2, . . . , depending on the change of the voltage level of the voltage signal Vin.

The longer the time Tc from the riding edge of each pulse signal PA and that of each pulse signal PB is, the higher the resolution of the digital data DO1 is. For example, double of the time Tc allows the voltage per each bit of the digital data DO1 to halve.

This feature provides that adjusting the time Tc permits a desired setting of the A/D converter's resolution, thereby easily achieving a high resolution of the A/D converter 1. In addition, because, the A/D converter 1 has preferably no analog circuits, advances in finer technologies of digital circuits promise the size of the A/D converter 1 to become further miniaturized.

Figure 3B:
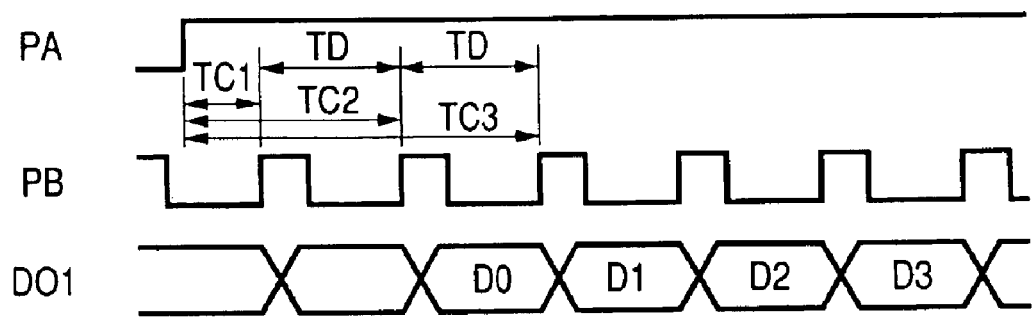
FIG. 3B is a time chart for explaining another one example of operations of the A/D converter according to the first embodiment of the present invention.

The structure of the A/D converter 1 uses both of the pulse signals PA and PB as control signals for the A/D converting operations. In this structure, the pulse signal PB can be only used as the control signal. In this case, as shown in FIG. 3B, the pulse signal PA indicates the start of the A/D converting operations.

This modification of the A/D converter 1 allows the signal processing circuit 19 to provide pieces of digital data corresponding to intervals TC1, TC2, TC3, . . . , of the pulse signals PA and PB at the riding edges of the pulse signals B, respectively. Thus, subtraction between each pair of pieces of digital data that are adjacent to each other, which corresponds to the intervals adjacent to each other in time, permits the digital data DO1 to be obtained.

To keep constant each pulse interval TD of the pulse signals PB, which is defined by the equation of "TCn−TC(n−1), where n is an integer greater than or equal to 2", provides the digital data DO1 corresponding to the voltage level of the voltage signal Vin. The longer each pulse interval TD is, the higher the resolution of the digital data DO1 is.

Figure 4:
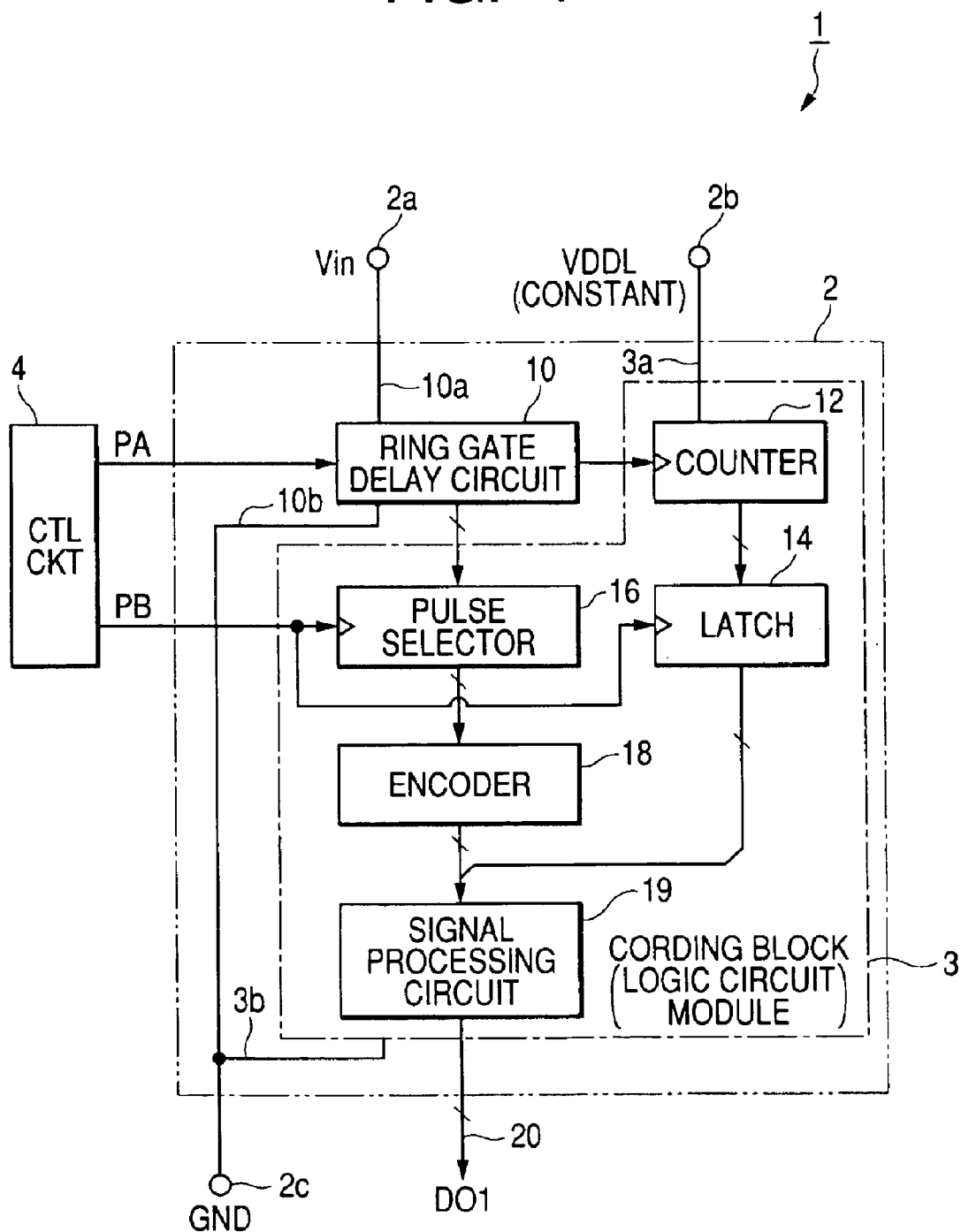
FIG. 4 is a block diagram mainly illustrating connection relationships among the A/D converter, power supply lines, and ground lines according to the first embodiment of the present invention.

Specifically in the first embodiment, as shown in FIGS. 1 and 4, the A/D converter 1 has a power supply line $3a$ connected to the other input terminal $2b$ and the coding block 3 composed of the counter 12, the latch 14, the pulse selector 16, the encoder 18, and the signal processing circuit 19. Through the other input terminal $2b$ and the power supply line $3a$, a power supply voltage (drive voltage) VDDL, which is preferably constant, is adapted to be applied to the coding block 3.

Determining the voltage level of the power supply voltage VDDL of the coding block 3 to a certain high level allows the operation speed of the counter 12 to be kept high. This feature guarantees normal operations of the A/D converter 1 even if the voltage level of the voltage signal Vin, which is to be A/D converted, is low. This is because the ring-gate delay circuit 10 has a very simple structure set forth above so that a minimum operating voltage of the counter 12 is higher than that of the ring-gate delay circuit 10. The minimum operating voltage of the counter 12 is defined as a minimum value of the power supply voltage required to allow the pulse signal outputted from the ring-gate delay circuit 10 to be normally counted. This results in expanding an input voltage range that the A/D converter 1 A/D converts to the low voltage side thereof.

In particular, in the first embodiment, each of the inverting circuits (NAND gate NAND, inverters INVa1 to an) is composed of CMOS transistors, and at least one of the counter 12 and the pulse selector 16 of the coding block 3 is also composed of CMOS transistors.

Figure 5:
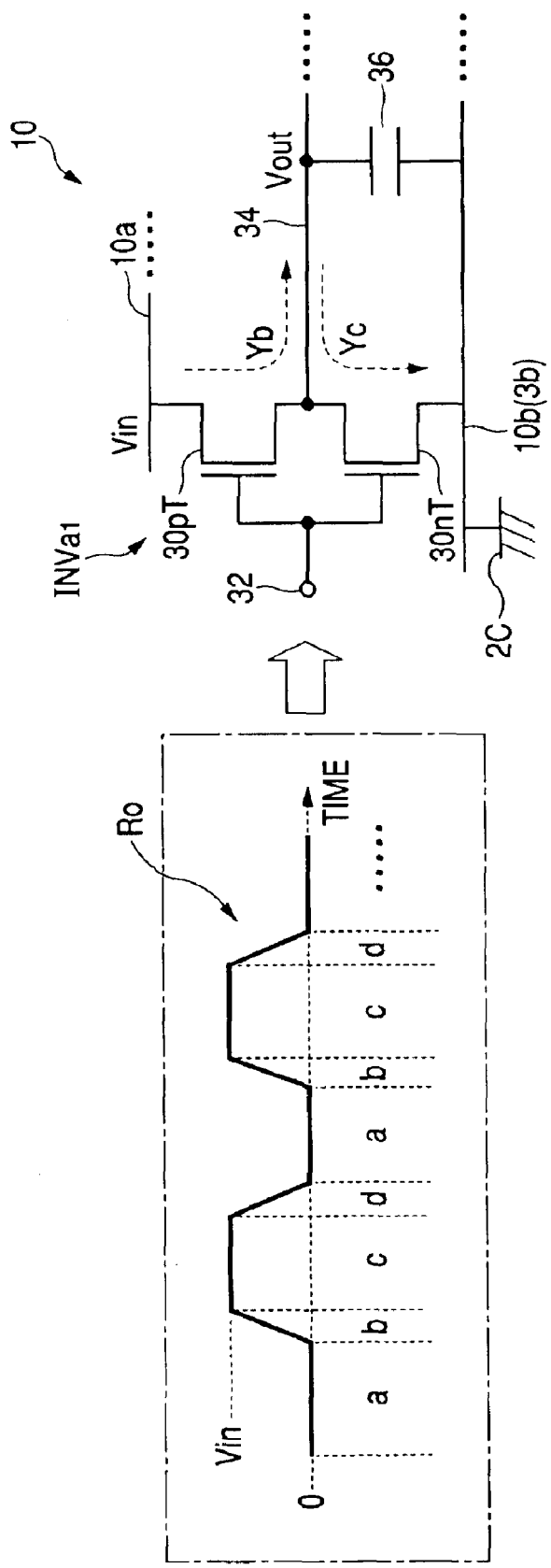
FIG. 5 is a schematic circuit diagram of a part of a ring-gate delay circuit shown in FIG. 1 for explaining operations of the A/D converter according to the first embodiment of the present invention.

FIG. 5 illustrates, for example, the inverter INVa1 of the ring-gate delay circuit 10. As shown in FIG. 5, the inverter INVa1 is provided with an inverter 30 composed of a pair of complementary transistors (a p-channel transistor 30pT and an n-channel transistor 30nT) with the source of the n-channel transistor 30nT connected to the drain of the p-channel transistor 30pT and the gates connected to each other. The gates of the transistors 30nT and 30pT are served as an input terminal 32 of the inverter 30. The source of the p-channel transistor 30pT is connected to the power supply line 10a to which the voltage signal Vin of the ring-gate delay circuit 10 is applied and the drain of the n-channel transistor 30nT is connected to a ground line 10b. The power supply line 10a and the ground line 10b correspond to a first pair of power supply lines.

The drain of the p-channel transistor 30pT is served as an output terminal and connected to an output line 34. In FIG. 5, reference character 36 represents a capacitance between the output line 34 and the ground line 10b.

Figure 6:
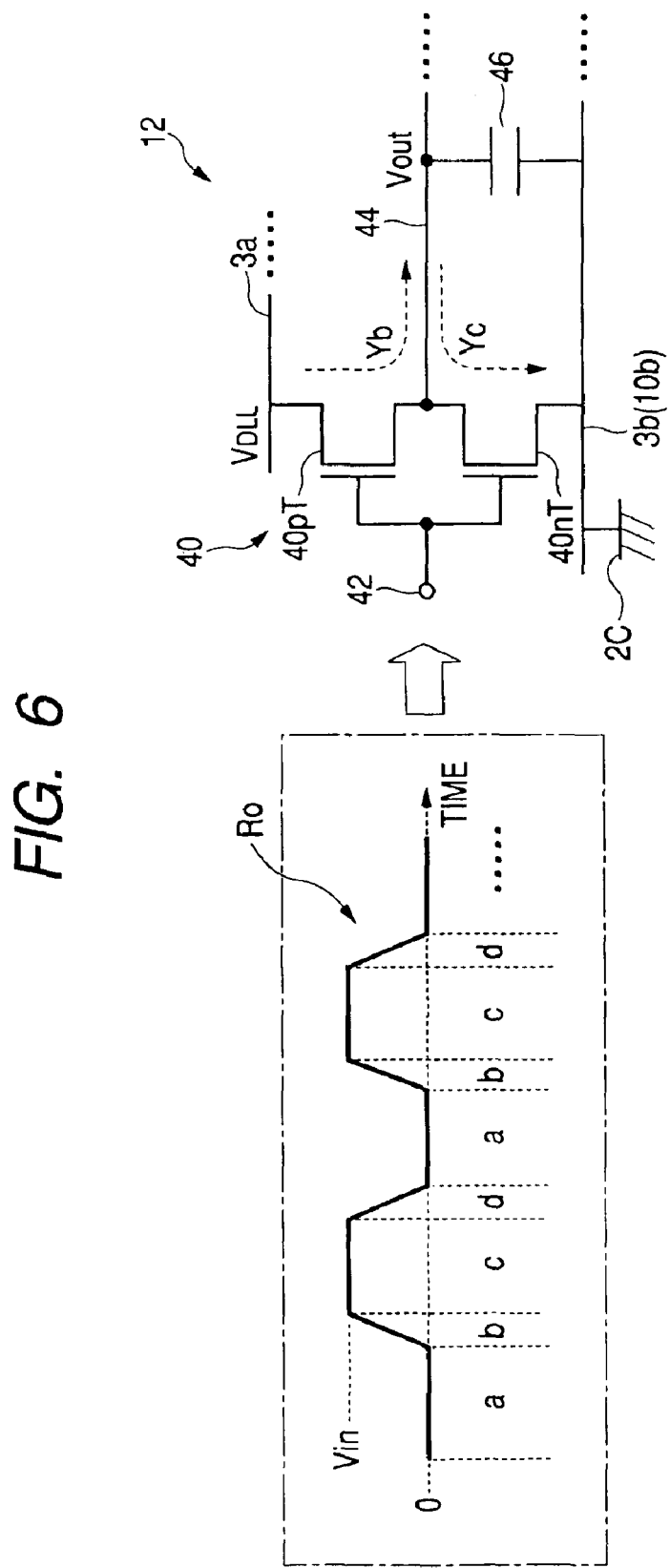
FIG. 6 is a schematic circuit diagram of a part of a coding block shown in FIG. 1 for explaining operations of the A/D converter according to the first embodiment of the present invention.

Similarly, FIG. 6 illustrates, for example, the counter 12 of the coding block 3. As shown in FIG. 6, the counter 3 is provided with an inverter 40 composed of a pair of complementary transistors (a p-channel transistor 40pT and an n-channel transistor 40nT), which have the same connection relationships as the pair of complementary transistors 30pT and 30nT. The gates of the transistors 40nT and 40pT are served as an input terminal 42 of the inverter 40. The source of the p-channel transistor 40pT is connected to the power supply line 3a to which the power supply voltage VDDL of the coding block 3 is applied and the drain of the n-channel transistor 30nT is connected to a ground line 3b. The drain of the p-channel transistor 40pT is served as an output terminal and connected to an output line 44. In FIG. 6, reference character 46 represents a capacitance between the output line 44 and the ground line 3b. The power supply line 3a and the ground line 3b correspond to a second pair of power supply lines.

As shown in FIGS. 1, 4–6, in the first embodiment, the ground line 3b of the coding block 3 is common with a ground line 10b of the ring-gate delay circuit 10. The common ground lines 3b and 10b are connected to a ground terminal 2c of the pulse phase difference coding circuit 2.

More specifically, in the A/D converter 1 of the first embodiment, the threshold voltages of the n-channel transistors 30nT and 40nT and those of the p-channel transistors 30pT and 40pT are referred to as "Vthn and Vthp", respectively. In addition, it is assumed that the absolute values of the threshold voltages Vthn and Vthp are represented as |Vthn| and |Vthp| and the sum of the absolute values |Vthn| and |Vthp| of the threshold voltages Vthn and Vthp is represented as "Vmax". In these assumptions, the power supply voltage VDDL of the coding block 3 is set to a range equal to or lower than the Vmax, and the input voltage range of the voltage signal Vin that the A/D converter 1 converts is set to a range equal to or lower than the Vmax. That is, the range of the power supply voltage VDDL is represented by the equation "VDDL≦Vmax (=|Vthn|+|Vthp|)", and the input voltage range of the voltage signal Vin is represented by the equation "Vin≦Vmax (=|Vthn|+|Vthp|)".

Specifically, in order to make both of the power supply voltage VDDL and the input voltage range of the voltage signal Vin of the A/D converter 1 small, it is possible to design both of the power supply voltage VDDL and the input voltage range of the voltage signal Vin to be small for meeting the equation "Vin≦|Vthn|+|Vthp|".

In the structure of the A/D converter 1, it is assumed that an input signal Ro having an input voltage range between a high voltage level of Vin and a low voltage level of 0V [volts] is inputted to the input terminal 42 of the inverter 40 constituting the coding block 3.

In this assumption, when the input signal Ro is kept at the low voltage level of 0[V], which is illustrated as each period of time "a" in FIG. 6, the p-channel transistor 40pT is on state and the n-channel transistor 40nT is off state. While the input signal Ro is being turned from the low voltage level to the high voltage level, which is illustrated as each period of time "b" in FIG. 6, when the voltage level of the input signal Ro exceeds the absolute value of the threshold voltage Vthp, the p-channel transistor 40pT is turned off. Subsequently, the voltage level of the input signal Ro exceeds the absolute value of the threshold voltage Vthn, the n-channel transistor 40nT is turned on. These switching operations cause a discharging current Yc to flow across the p-channel transistor 40pT out to the capacitance 46.

Next, when the input signal Ro is kept at the high voltage level of Vin, which is illustrated as each period of time "c" in FIG. 6, the p-channel transistor 40pT is off state and the n-channel transistor 40nT is on state. While the input signal Ro is being turned from the high voltage level to the low voltage level, which is illustrated as each period of time "d" in FIG. 6, when the voltage level of the input signal Ro drops to less than the absolute value of the threshold voltage Vthn, the n-channel transistor 40nT is turned off. Subsequently, the voltage level of the input signal Ro drops less than the absolute value of the threshold voltage Vthp, the p-channel transistor 40pT is turned on. These switching operations cause a charging current Yb to flow across the p-channel transistor 40pT out to the capacitance 46.

Figure 7:
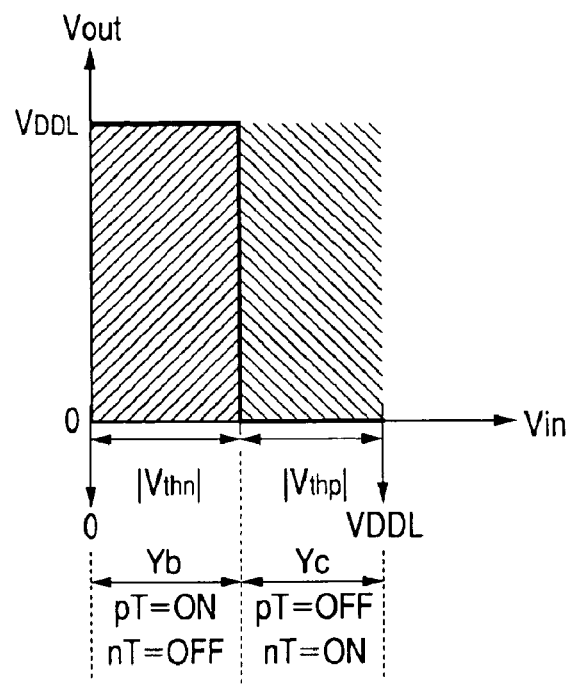
FIG. 7 is a graph representing a relationship between a voltage signal Vin inputted to the ring-gate delay circuit and a voltage signal Vout outputted therefrom according to the first embodiment of the present invention.

Specifically, in the structure of the A/D converter 1, the set of the power supply voltage VDDL of the coding block 3 to satisfy the equation of "VDDL≦=|Vthn|+|Vthp|" allows the p-channel transistor 40pT and the n-channel transistor 40nT not to be simultaneously turned on (see FIG. 7). That is, types of currents flowing across the inverter 40 during the periods of "a", "b", "c", and "d" are represented as the following table 1:

TABLE 1

| VDDL ≦ |Vthp| + |Vthn| | | | |
|---|---|---|---|
| a | b | c | d |
| NOT FLOW | DISCHARGING CURRENT (Yc) | NOT FLOW | CHARGING CURRENT (Yb) |

Incidentally, the discharging current Yc may flow during the period "c", and the discharging current Yb may flow during the period "a".

As compared with the structure of the A/D converter 1, it is assumed that the range of the power supply voltage VDDL is set to a range larger than the the Vmax (=|Vthn|+|Vthp|)

Figure 8:
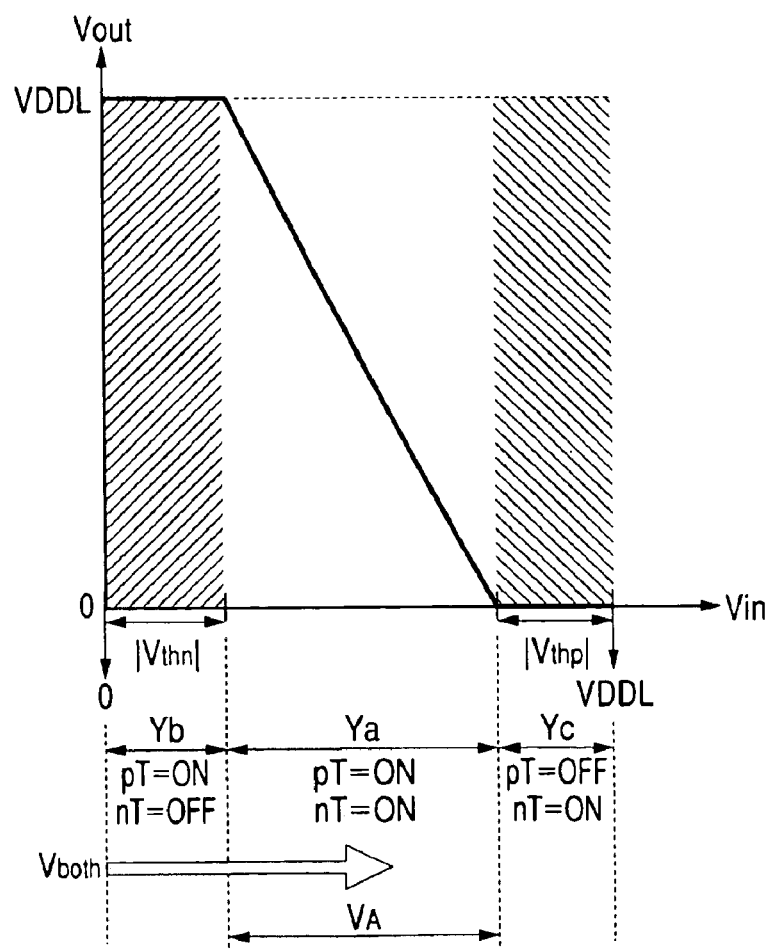
FIG. 8 is a graph representing a relationship between a voltage signal Vin inputted to a conventional ring-gate delay circuit and a voltage signal Vout outputted therefrom according to the first embodiment of the present invention.

In this assumption, FIG. 8 shows a graph representing a relationship between the output voltage Vout of the inverter 300 and the voltage of the input terminal 320 thereof when the voltage signal Vin is inputted to the input terminal 320 of the inverter 300. The vertical axis indicates the output voltage Vout and the horizontal axis represents the voltage of the input terminal 320.

Figure 13:
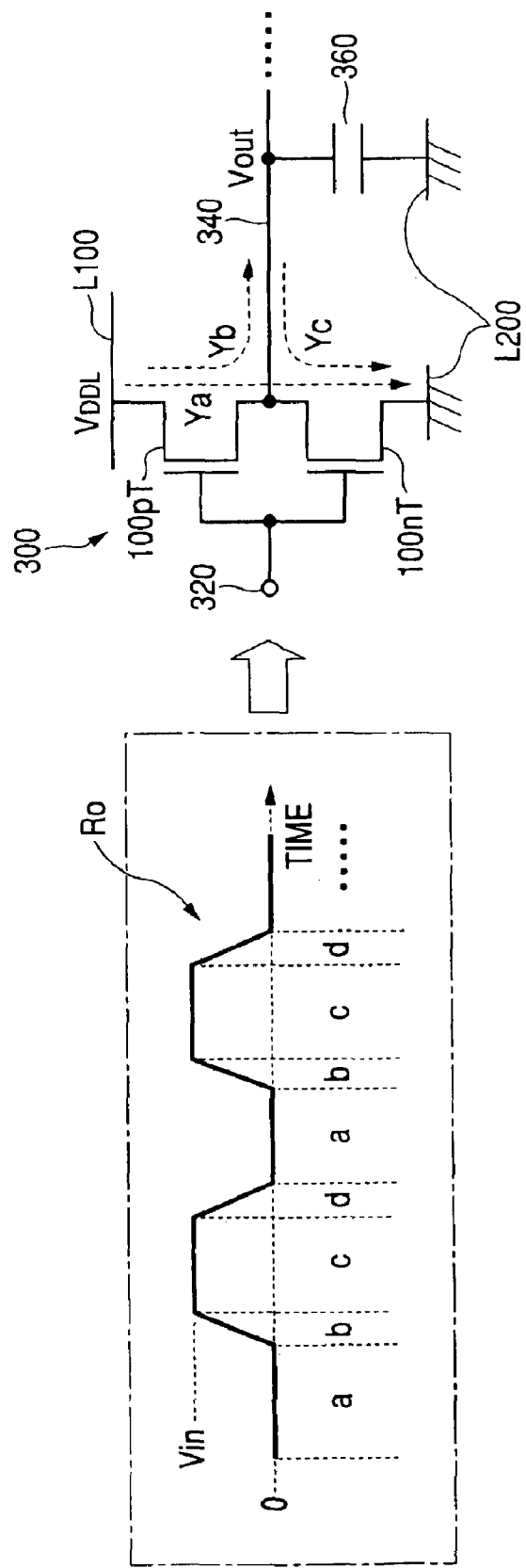
FIG. 13 is a graph representing a relationship between a voltage signal Vin inputted to a ring-gate delay circuit and a voltage signal Vout outputted therefrom according to a conventional A/D converter.

As shown in FIGS. 13 and 8, while the voltage level of the input signal Ro is the voltage level of the voltage signal Vin, the voltage level of the input terminal 320 of the inverter 300 may be turned to a voltage level Vboth within a voltage range VA that may cause the p-channel transistor 100pT and the n-channel transistor 100nT to be simultaneously turned on (see a heavy-line arrow in FIG. 8).

This may cause, because the voltage level of the voltage signal Vin may be kept within the voltage range VA, a tunneling current Ya to constantly flow between the power supply line L100 and the ground line L200 (see FIG. 8). This may result in increasing power consumption of the A/D converter.

For example, it is assumed that such an A/D converter disclosed in FIG. 13 is composed of CMOS circuits each having the threshold voltage Vthn set to approximately 1 [V] and the threshold voltage Vthp set to approximately −1 [V] and that the power supply voltage VDDL is set to 5 [V], which is larger than the the Vmax (=|Vthn|+|Vthp|)

Figure 9:
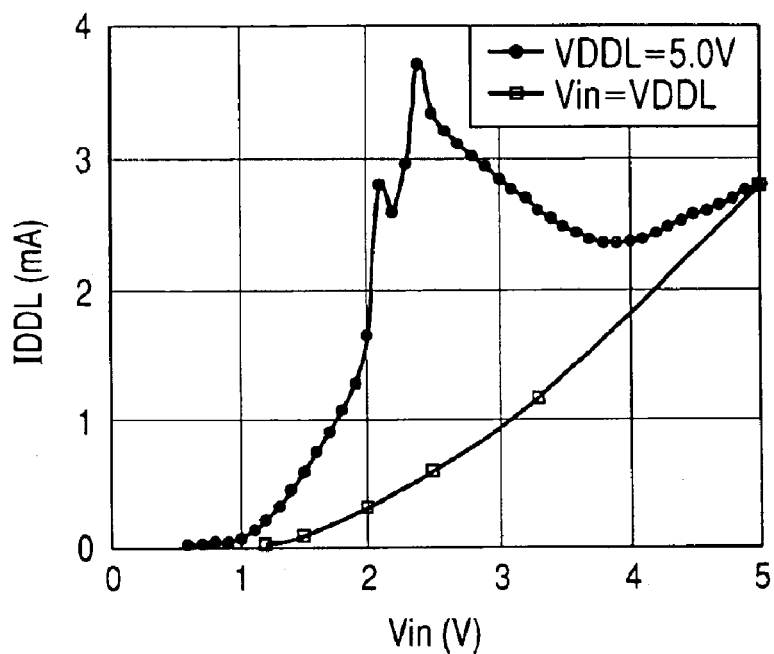
FIG. 9 is a graph representing one example of a relationship between the voltage signal Vin and a current consumption based on a power supply voltage VDDL according to the first embodiment of the present invention.

In this assumption, when the voltage signal Vin inputted to the ring-gate delay circuit varies within the range between 0 [V] and 5 [V], current consumption IDDL based on the power supply voltage VDDL is represented by a heavy line connecting a plurality of black circles of "●" in FIG. 9. As clearly shown in FIG. 9, when the voltage signal Vin reaches approximately 2.5 [V], the current consumption IDDL due to the amount of the tunneling current Ya dramatically increases. In FIG. 9, a line connecting a plurality of squares of "□" represents current consumption IDDL based on the power supply voltage VDDL when the power supply voltage VDDL is equal to the voltage level of the voltage signal Vin.

However, in the first embodiment, as clearly shown in FIG. 7 and the table 1, the power supply voltage VDDL of the coding block 3 is equal to or lower than the sum of the absolute values of the threshold voltages Vthn and Vthp. The voltage potential difference between the voltage of "|Vthn|+|Vthp|" and the power supply voltage VDDL blocks the flow of a tunneling current between the power supply line 3a and the ground line 3b independently of the level of the input signal Ro, allowing current consumption in the inverter 40 to decrease.

If each of the elements of the coding block 3 is composed of logic gates, such as inverters therein (see FIG. 6), the logic gates can commonly provide the effects of decreasing current consumption therein, respectively. This is because the power supply voltage VDDL of the coding block 3 is set to satisfy the equation of "VDDL≦=|Vthn|+|Vthp|" so that, if any voltage level of the input signal Vin is inputted to each of the logic gates, it may be difficult to turn on both of the p-channel transistor and the n-channel transistor which constitute each of the logic gates.

This prevents a tunneling current from flowing between the power supply line 3a and the ground line 3b when each of the logic gates operates, permitting power consumption in the coding block 3 to decrease.

Similarly, in the first embodiment, the set of the input voltage range of the voltage signal Vin to meet the equation of "Vin≦=|Vthn|+|Vthp|" allows the p-channel transistor 30pT and the n-channel transistor 30nT of each of the inverting circuits (see FIG. 5) not to be simultaneously turned on (see FIG. 7). This prevents a tunneling current from flowing between the power supply line 10a and the ground line 10b, allowing power consumption in the ring-gate delay circuit 10 to decrease.

As described above, the A/D converter 1 according to the first embodiment permits power consumption in the whole of the converter 1 to certainly decrease.

Figure 10:
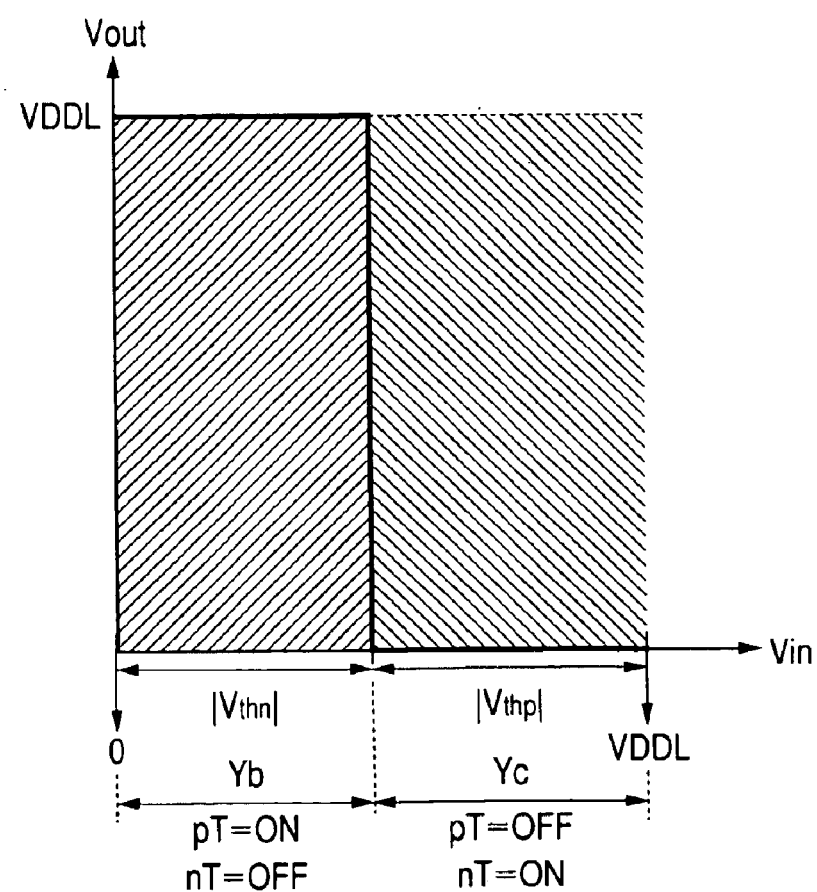
FIG. 10 is a graph representing another one example of a relationship between a voltage signal Vin inputted to the ring-gate delay circuit and a voltage signal Vout outputted therefrom according to the first embodiment of the present invention.

In the first embodiment, adjusting both of the power supply voltage VDDL and the input voltage range of the voltage signal Vin establishes the relationship represented by the equation "Vin≦|Vthn|+|Vthp|". In a modification, adjusting both of the threshold voltages Vthn and Vthp permits the Vmax to increase (see FIG. 10).

[Second Embodiment]

An A/D converter according to a second embodiment of the present invention has the substantially same structure as the structure of the A/D converter 1 of the first embodiment except for the set of the input voltage range of the voltage signal Vin and the power supply voltage VDDL. Elements of the A/D converter according to the second embodiment are assigned to the same reference characters as the A/D converter 1 shown in FIG. 1 and so on.

In the A/D converter according to the second embodiment, the power supply voltage VDDL is set to a range equal to or higher than the Vmax (=|Vthn|+|Vthp|), and the input voltage range of the voltage signal Vin and the power supply voltage VDDL is set to meet the relationship represented by the following equation:

$$VDDL - |Vthp| \leq Vin \leq VDDL$$

This relationship of the voltage signal Vin and the power supply voltage VDDL allows the p-channel transistor 40pT and the n-channel transistor 40nT of at least one of the logic gates in the coding block 3 not to be simultaneously turned on while the level of the input signal Ro is kept to the high level.

Figure 11:
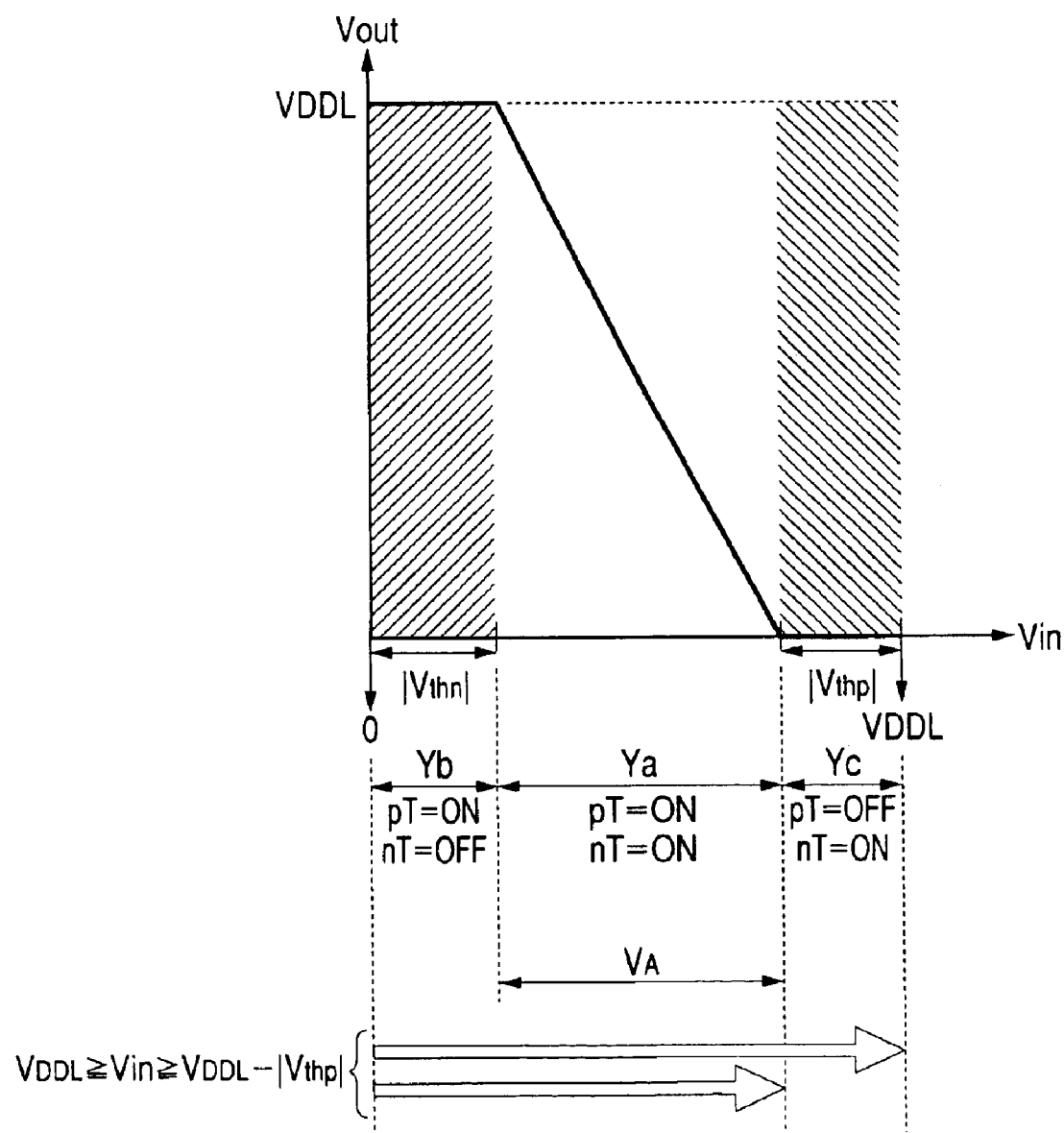
FIG. 11 is a graph representing one example of a relationship between a voltage signal Vin inputted to a ring-gate delay circuit and a voltage signal Vout outputted therefrom according to a second embodiment of the present invention.

This is because, when the input signal Ro inputted to the coding block 3 from the ring-gate delay circuit 10 has the high level, the voltage of the input signal Ro is equal to or higher than a voltage represented by the equation "VDDL−|Vthp|" (see heavy-line arrows in FIG. 11).

This causes a period of time during which the voltage level of the input signal is within the range of the VA to be short, thereby preventing a constant tunneling current from flowing between the power supply line 2b and the ground line 3b (ground terminal 2c).

As described above, the A/D converter according to the second embodiment allows power consumption in the whole of the converter 1 to certainly decrease.

This effect is clear because, in FIG. 9, the current consumption IDDL based on the power supply voltage VDDL represented as the line connecting the squares of "□" corresponding to the case of setting the "VDDL=Vin" is smaller than that based on the power supply voltage VDDL represented as the line connecting the black circles of "●".

Incidentally, in the A/D converters according to first and second embodiments, the ring-gate delay circuit 10 preferably corresponds to a pulse delay circuit, and the coding block 3 preferably corresponds to a logic gate (logic circuit). The time Tc between the rising edge of the pulse signal PA and that of the pulse signal PB or the time TD defined by the equation of "TCn−TC(n−1)" corresponds to a setting time.

In the A/D converters according to the first and second embodiments, it is preferable that the counter 12 and the ring-gate delay circuit 10 are so designed that an operating frequency (operating period) of the counter 12 is sufficiently faster than an oscillating period required for the rising edge of the pulse signal PA to circulate one time through the inverting circuits in the ring-gate delay circuit 10.

In particular, it is possible to make the counter 12 itself operate faster. In another way to increase the operating speed of the counter 12, the number Nrdu of stages of the inverting circuits constituting the ring-gate delay circuit 10 may be larger than the number Ncgt of stages of logic gates in a critical path in the counter 12.

The critical path represents the longest path in all paths from the input terminal of the counter 12 to the output terminal of the counter 12. That is, the number Ncgt of the stages of the logic gates through which a signal inputted to the input terminal and transferred along the critical path passes. The counter 12 is designed as a conventional synchronous counter composed of a plurality of stages of D-type flip flops (D-FF), a plurality of inverters INV, a plurality of AND gates AND, and a plurality of switches SW. The structure of the synchronous counter 12 except for the number Ncgt of the stages of the logic gates in the critical path are well known so that the structure of the synchronous counter 12 is omitted. The C0 to C(Ncgt+1) represent the predetermined bits of binary digital data outputted from the counter 12. That is, the number of C(Ncgt+1) bits of binary digital data is outputted from the counter 12.

Figure 12:
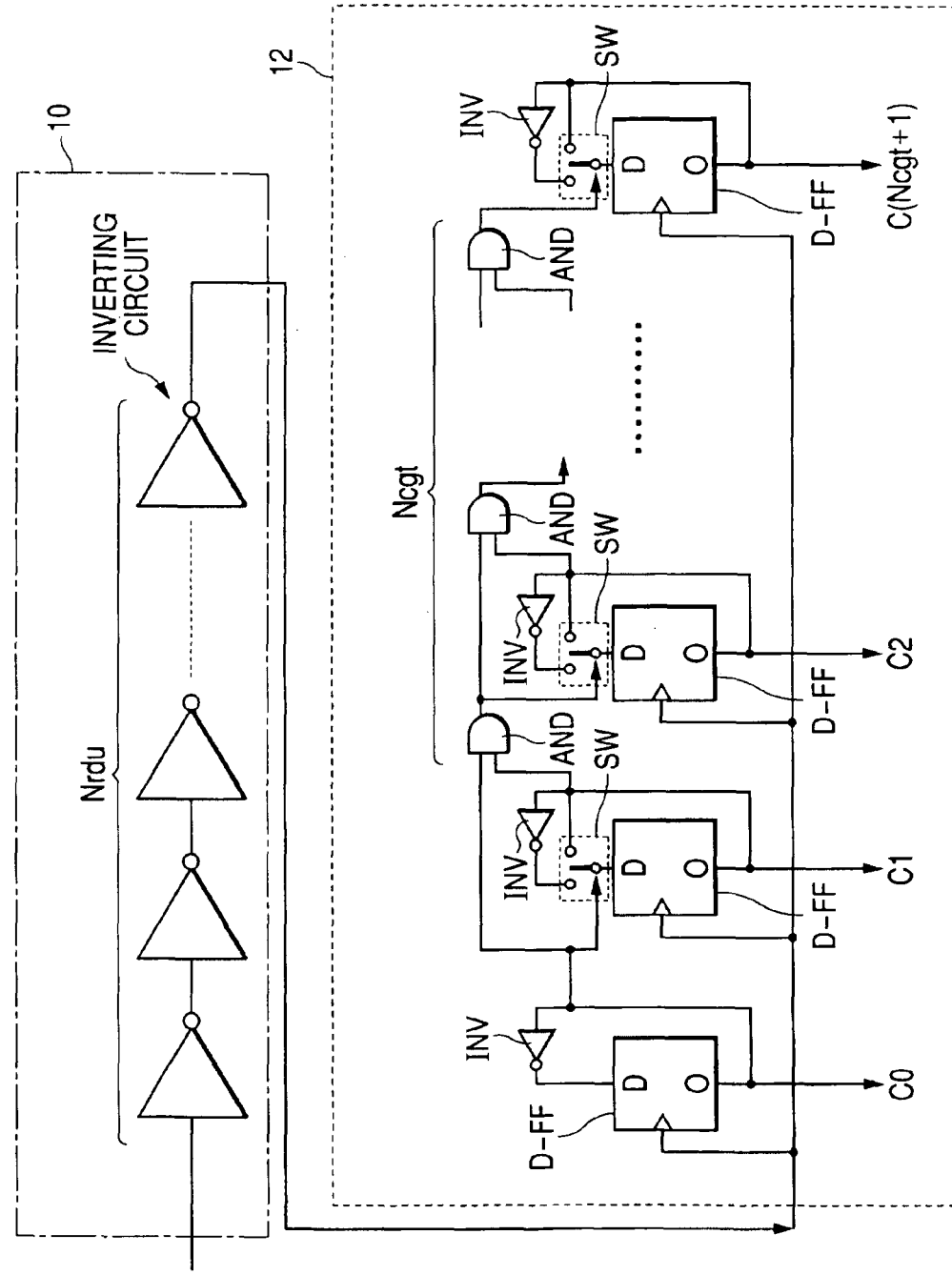
FIG. 12 is a block diagram schematically illustrating the ring-gate delay circuit and a counter shown in FIG. 1 according to a modification of the A/D converter of the first embodiment of the present invention.

In this structure shown in FIG. 12, it is preferable that the number Nrdu of stages of the inverting circuits and the number Ncgt of stages of the logic gates in the critical path meet the relationship represented by the equation "Nrdu$\geq$1.5×Ncgt". It is more preferable that the number Nrdu of stages of the inverting circuits and the number Ncgt of stages of the logic gates in the critical path satisfy the relationship represented by the equation "Nrdu$\geq$2.0×Ncgt".

Because the number Nrdu of stages of the inverting circuits is larger than the number Ncgt of stages of the logic gates in the critical path, the operating speed of the counter 12 is sufficiently faster than that of the oscillating period of the ring-gate delay circuit 10. This causes a minimum value of the power supply voltage VDDL required to count the number of times of the circulation of the rising edge of the pulse signal PA to be set low. In other words, the minimum value of the power supply voltage VDDL is required to cause the A/D converter to execute the A/D converting operations.

Lowering the minimum value of the power supply voltage VDDL permits the power consumption of the A/D converter to further decrease.

Designing the ring-gate delay circuit 10 to increase the number Nrdu of the stages of the inverters extends the oscillating period. The extension of the oscillating period reduces the operating period of the counter 12, thereby further decreasing the power consumption of the A/D converter.

Recently, it is considered that a ubiquitous battery having a low power capacity makes an electronic device operate. The ubiquitous battery generates power based on solar light, body heat, foot operations, or the like. The A/D converters according to the present invention are operable in low power consumption so that the A/D converters are very suitable for operating with the ubiquitous batteries. The A/D converters according to the present invention are operable in low power consumption even if each of the components of the A/D converters is a digital circuit, such as a CMOS circuit. This results in that each of the A/D converters according to the present invention operates based on the ubiquitous battery without using step-up circuits.

When each of the A/D converters according to the present invention operates in the ubiquitous battery installed therein, noise signal components generated from a power supply circuit of the ubiquitous battery may crosstalk with the voltage signal Vin. Each of the A/D converters having the ring-gate delay circuit according to the present invention, even if the noise signal components generated from the power supply circuit of the ubiquitous battery crosstalks with the voltage signal Vin, has a filtering function for eliminating high-frequency components from the input voltage signal Vin. This filtering function is disclosed in detail in U.S. Pat. No. 6,509,861 that is incorporated totally herein by reference.

When any one of the A/D converters according to the present invention is applied for a sensor circuit disclosed in the U.S. Pat. No. 6,255,976 and the applied A/D converter operates based on the ubiquitous battery installed therein, a noise signal containing low-frequency noise components caused in the sensor circuit may crosstalk with the voltage signal Vin. Even if the low-frequency noise components crosstalks with the voltage signal Vin, any one of the A/D converters executes a method of eliminating the low-frequency noise components from the input voltage signal Vin in accordance with the procedures disclosed in U.S. Pat. No. 6,255,976 that is incorporated totally herein by reference. This execution of the low-frequency noise components eliminating procedures allows the influence of the low-frequency noise components with respect to the voltage signal Vin to decrease.

As described above, the first and second embodiments of the present invention are explained as examples set forth above, and the present invention can include various types of modifications.

That is, in place of the ring-gate delay circuit 10, a pulse gate delay circuit having a function for sequentially inverting a pulse signal while delaying it depending on a voltage signal Vin applied to the pulse gate delay circuit can be used.

In addition, in place of the ring-gate delay circuit 10, a pulse gate delay circuit having an even number of stages of inverters can be used. The ring-gate delay circuit having the even number of the stages of inverters circulates a main pulse edge and a reset pulse edge through the even number of the inverters, respectively. As compared with the structure of the ring-gate delay circuit having the even number of the stages of inverters, the ring-gate delay circuit shown in FIG. 1 has an advantage in power consumption. This is because the ring-gate delay circuit having the even number of the stages of inverters circulates one type of the rising pulse edge. This structure is disclosed in detail in U.S. Pat. No. 5,416,444 that is incorporated totally herein by reference.

In place of the ring-gate delay circuit 10, a pulse delay circuit has a plurality of inverting circuits corresponding to a plurality of stages of delay and serially connected to one another in a cascade. The structure of the pulse delay circuit is disclosed in FIG. 1A of U.S. Pat. No. 6,509,861 that is incorporated totally herein by reference.

The ground line 3b of the coding block 3 may be separated from the ground line 10b of the ring-gate delay circuit 10. In this case, ground terminals may be connected to the ground lines 3b and 10b, respectively.

While there has been described what is at present considered to be these embodiment and modifications of the invention, it will be understood that various modifications which are not described yet may be made therein, and it is intended to cover in the appended claims all such modifications as fall within the true spirit and scope of the invention.

What is claimed is:

1. An analog-to-digital converter for converting an analog voltage signal into digital data, comprising:
   a pulse delay circuit including a plurality of inverting circuits to each of which the analog voltage signal is inputted through a first pair of power supply lines connected thereto, the inverting circuits being sequentially connected with each other, each of the inverting circuits comprising a first logic gate and operating to invert a pulse signal inputted thereto so as to output an inversion of the pulse signal, the inverting operation of each of the inverting circuits providing a predetermined delay time, the delay time of each of the inverting circuits depending on a level of the voltage signal;
   a voltage signal input terminal connected to one of the first paired power supply lines through which the voltage signal is applied; and
   a logic circuit having a second logic gate and a second pair of power supply lines, the logic circuit operating based on a constant power supply voltage inputted to one of the second paired power supply lines to detect a number of the inverting circuits through which the pulse signal passes within a predetermined setting time so as to generate digital data according to the detected number of the inverting circuits,
   wherein at least one of a first range of the level of the voltage signal and a second range of the power supply voltage is set to prevent a tunneling current from flowing at least one of between the first paired power supply lines and between the second paired power supply lines when at least one of the first and second logic gates operates.

2. An analog to digital converter according to claim 1, wherein the first logic gate includes opposite conductivity types of transistors each having a threshold voltage, and the first voltage range of the level of the voltage signal is set to prevent the opposite conductivity types of transistors from being simultaneously turned on.

3. An analog to digital converter according to claim 2, wherein the first voltage range of the level of the voltage signal is set to a range equal to or lower than a sum of absolute values of the threshold voltages.

4. An analog to digital converter according to claim 1, wherein the second logic gate includes opposite conductivity types of transistors each having a threshold voltage, and the second voltage range of the power supply voltage is set to prevent the opposite conductivity types of transistors from being simultaneously turned on.

5. An analog to digital converter according to claim 4, wherein the second voltage range of the power supply voltage is set to a range equal to or lower than a sum of absolute values of the threshold voltages.

6. An analog to digital converter according to claim 1, wherein the other of the first paired power supply lines and the other of the second paired power supply lines are common with each other.

7. An analog to digital converter according to claim 1, wherein the pulse delay circuit is a ring-gate delay circuit so that the plurality of inverting circuits are connected to each other in a ring, allowing the pulse signal to circulate through the plurality of inverting circuits, the logic circuit comprises a counter operating to count a number of times of a circulation of the pulse signal within the predetermined setting time and detects the number of the inverting circuits through which the pulse signal passes within the predetermined setting time according to the number of times of the circulation of the pulse signal counted by the counter and a circulation position at which the pulse signal has reached in the ring-gate delay circuit at an end of the predetermined setting time, and wherein an operating period of the counter is faster than an oscillating period required for the pulse signal to circulate one time through the inverting circuits in the ring-gate delay circuit.

8. An analog to digital converter according to claim 7, wherein the counter comprises a plurality of logic gates, and a number of the inverting circuits of the ring-gate delay circuit is larger than that of stages of the logic gates in a critical path of the counter.

9. An analog to digital converter according to claim 8, wherein the number of the inverting circuits of the ring-gate delay circuit is referred to as Nrdu, the number of stages of the logic gates in the critical path of the counter is referred to as Ncgt, and the Nrdu and the Ncgt satisfy the following equation:

$$Nrdu \geq 1.5 \times Ncgt.$$

10. An analog to digital converter according to claim 8, wherein the number of the inverting circuits of the ring-gate delay circuit is referred to as Nrdu, the number of stages of the logic gates along the critical path of the counter is referred to as Ncgt, and the Nrdu and the Ncgt satisfy the following equation:

$$Nrdu \geq 2 \times Ncgt.$$

11. An analog to digital converter according to claim 7, wherein a number of the inverting circuits of the ring-gate delay circuit is an odd number.

12. An analog-to-digital converter for converting an analog voltage signal into digital data, comprising:
   a pulse delay circuit including a plurality of inverting circuits to each of which the analog voltage signal is inputted through a first pair of power supply lines connected thereto, the inverting circuits being sequentially connected with each other, each of the inverting circuits operating to invert a pulse signal inputted thereto so as to output an inversion of the pulse signal, the inverting operation of each of the inverting circuits providing a predetermined delay time, the delay time of each of the inverting circuits depending on a level of the voltage signal;
   a voltage signal input terminal connected to one of the first paired power supply lines through which the voltage signal is applied; and
   a logic circuit having a logic gate and a second pair of power supply lines, the logic circuit operating based on a constant power supply voltage inputted to one of the second paired power supply lines to detect a number of the inverting circuits through which the pulse signal passes within a predetermined setting time so as to generate digital data according to the detected number of the inverting circuits,
   wherein a first range of the level of the voltage signal and a second range of the power supply voltage are set to prevent a constant tunneling current from flowing between the second paired power supply lines when the logic gate operates.

13. An analog to digital converter according to claim 12, wherein the logic gate includes opposite conductivity types of transistors each having a threshold voltage, and the first range of the level of the voltage signal and the second range of the power supply voltage are set to prevent the opposite conductivity types of transistors from being simultaneously turned on.

14. An analog to digital converter according to claim 12, wherein the pulse delay circuit and logic circuit are CMOS circuits, respectively, the other of the first paired power supply lines and the other of the second paired power supply lines are common with each other, the logic gate includes a n-channel transistor with a threshold voltage Vthn and a p-channel transistor with a threshold voltage Vthp, a sum of absolute values of the threshold voltages Vthn and Vthp is referred to as Vmax, the power supply voltage is referred to as VDDL, the voltage signal is referred to as Vin, the first range of the level of the voltage signal and the second range of the power supply voltage are set to satisfy the following equations:

$$VDDL \geq Vmax$$

$$VDDL - |Vthp| \leq Vin \leq VDDL$$

where |Vthp| represents the absolute value of the threshold voltage Vthp.

15. An analog to digital converter according to claim 12, wherein the pulse delay circuit is a ring-gate delay circuit so that the plurality of inverting circuits are connected to each other in a ring, allowing the pulse signal to circulate through the plurality of inverting circuits, the logic circuit comprises a counter operating to count a number of times of a circulation of the pulse signal within the predetermined setting time and detects the number of the inverting circuits through which the pulse signal passes within the predetermined setting time according to the number of times of the circulation of the pulse signal counted by the counter and a circulation position at which the pulse signal has reached in the ring-gate delay circuit at an end of the predetermined setting time, and wherein an operating period of the counter is faster than an oscillating period required for the pulse signal to circulate one time through the inverting circuits in the ring-gate delay circuit.

16. An analog to digital converter according to claim 15, wherein the counter comprises a plurality of logic gates, and a number of the inverting circuits of the ring-gate delay circuit is larger than that of stages of the logic gates in a critical path of the counter.

17. An analog to digital converter according to claim 16, wherein the number of the inverting circuits of the ring-gate delay circuit is referred to as Nrdu, the number of stages of the logic gates in the critical path of the counter is referred to as Ncgt, and the Nrdu and the Ncgt satisfy the following equation:

$$Nrdu \geq 1.5 \times Ncgt.$$

18. An analog to digital converter according to claim 16, wherein the number of the inverting circuits of the ring-gate delay circuit is referred to as Nrdu, the number of stages of the logic gates along the critical path of the counter is referred to as Ncgt, and the Nrdu and the Ncgt satisfy the following equation:

$$Nrdu \geq 2 \times Ncgt.$$

19. An analog to digital converter according to claim 15, wherein a number of the inverting circuits of the ring-gate delay circuit is an odd number.

20. An analog-to-digital converter for converting an analog voltage signal into digital data, comprising:

a pulse delay circuit including a plurality of inverting circuits to each of which the analog voltage signal is inputted through a first pair of power supply lines connected thereto, the inverting circuits being sequentially connected with each other, each of the inverting circuits comprising a first logic gate and operating to invert a pulse signal inputted thereto so as to output an inversion of the pulse signal, the inverting operation of each of the inverting circuits providing a predetermined delay time, the delay time of each of the inverting circuits depending on a level of the voltage signal;

a voltage signal input terminal connected to one of the first paired power supply lines through which the voltage signal is applied; and a logic circuit having a second logic gate and a second pair of power supply lines, the logic circuit operating based on a power supply voltage inputted to one of the second paired power supply lines to detect a number of the inverting circuits through which the pulse signal passes within a predetermined setting time so as to generate digital data according to the detected number of the inverting circuits, wherein the second logic gate includes opposite conductivity types of transistors each having a threshold voltage, and the second voltage range of the power supply voltage is set to a range equal to or lower than a sum of absolute values of the threshold voltages.

21. An analog-to-digital converter for converting an analog voltage signal into digital data, comprising:

a pulse delay circuit including a plurality of inverting circuits to each of which the analog voltage signal is inputted through a first pair of power supply lines connected thereto, the inverting circuits being sequentially connected with each other, each of the inverting circuits comprising a first logic gate and operating to invert a pulse signal inputted thereto so as to output an inversion of the pulse signal, the inverting operation of each of the inverting circuits providing a predetermined delay time, the delay time of each of the inverting circuits depending on a level of the voltage signal;

a voltage signal input terminal connected to one of the first paired power supply lines through which the voltage signal is applied; and a logic circuit having a second logic gate and a second pair of power supply lines, the logic circuit operating based on a power supply voltage inputted to one of the second paired power supply lines to detect a number of the inverting circuits through which the pulse signal passes within a predetermined setting time so as to generate digital data according to the detected number of the inverting circuits, wherein the first logic gate includes opposite conductivity types of transistors each having a threshold voltage, and the first voltage range of the power supply voltage is set to a range equal to or lower than a sum of absolute values of the threshold voltages.

* * * * *